United States Patent
Kapetanic et al.

(10) Patent No.: US 6,292,000 B1
(45) Date of Patent: Sep. 18, 2001

(54) PROCESS FOR HARMONIC MEASUREMENT WITH ENHANCED PHASE ACCURACY

(75) Inventors: Peter Kapetanic, Morgan Hill; Jon Martens; David Rangel, both of San Jose, all of CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/388,015

(22) Filed: Sep. 1, 1999

Related U.S. Application Data

(60) Provisional application No. 60/098,864, filed on Sep. 2, 1998.

(51) Int. Cl.[7] ................................................. G01R 27/28
(52) U.S. Cl. ....................... 324/623; 324/615; 324/76.19
(58) Field of Search ................................ 324/601, 612, 324/615, 623, 650, 76.19

(56) References Cited

U.S. PATENT DOCUMENTS

| | | | |
|---|---|---|---|
| 3,016,475 | * | 1/1962 | Kirsten .............................. 324/76.77 |
| 5,089,782 | * | 2/1992 | Pike et al. .......................... 324/623 |
| 5,307,284 | * | 4/1994 | Brunfeldt et al. .................... 364/685 |
| 5,343,404 | * | 8/1994 | Girgis ................................. 364/484 |
| 5,631,553 | * | 5/1997 | Bose et al. ......................... 324/76.24 |
| 5,642,039 | * | 6/1997 | Bradley et al. ..................... 324/76.53 |
| 5,937,006 | * | 8/1999 | Clark et al. .......................... 375/224 |

* cited by examiner

Primary Examiner—Glenn W. Brown
Assistant Examiner—Vincent Q. Nguyen
(74) Attorney, Agent, or Firm—Fliesler Dubb Meyer & Lovejoy LLP

(57) ABSTRACT

A method for determining the harmonic phase response ∠POx of a device under test (DUT) is performed on a vector network analyzer (VNA). The phase ∠GN1 of the transfer response GN1 of the DUT at the fundamental frequency is determined from VNA measurements after appropriate normalization. The corrected phase ∠GHxC of the harmonic transfer response of the DUT is determined from VNA measurements after appropriate normalization. The corrected phase ∠GHxC of the harmonic transfer coefficient GHx is subtracted from a predetermined phase reference ∠refx to obtain a difference ∠refx-∠GHxC, and the phase ∠GN1 of the transfer coefficient GN1 at the fundamental frequency is added to the difference ∠refx-∠GHxC to obtain the harmonic phase offset ∠POx. For the second and third harmonics using a clipping waveform, the phase reference ∠refx is 180°.

10 Claims, 3 Drawing Sheets

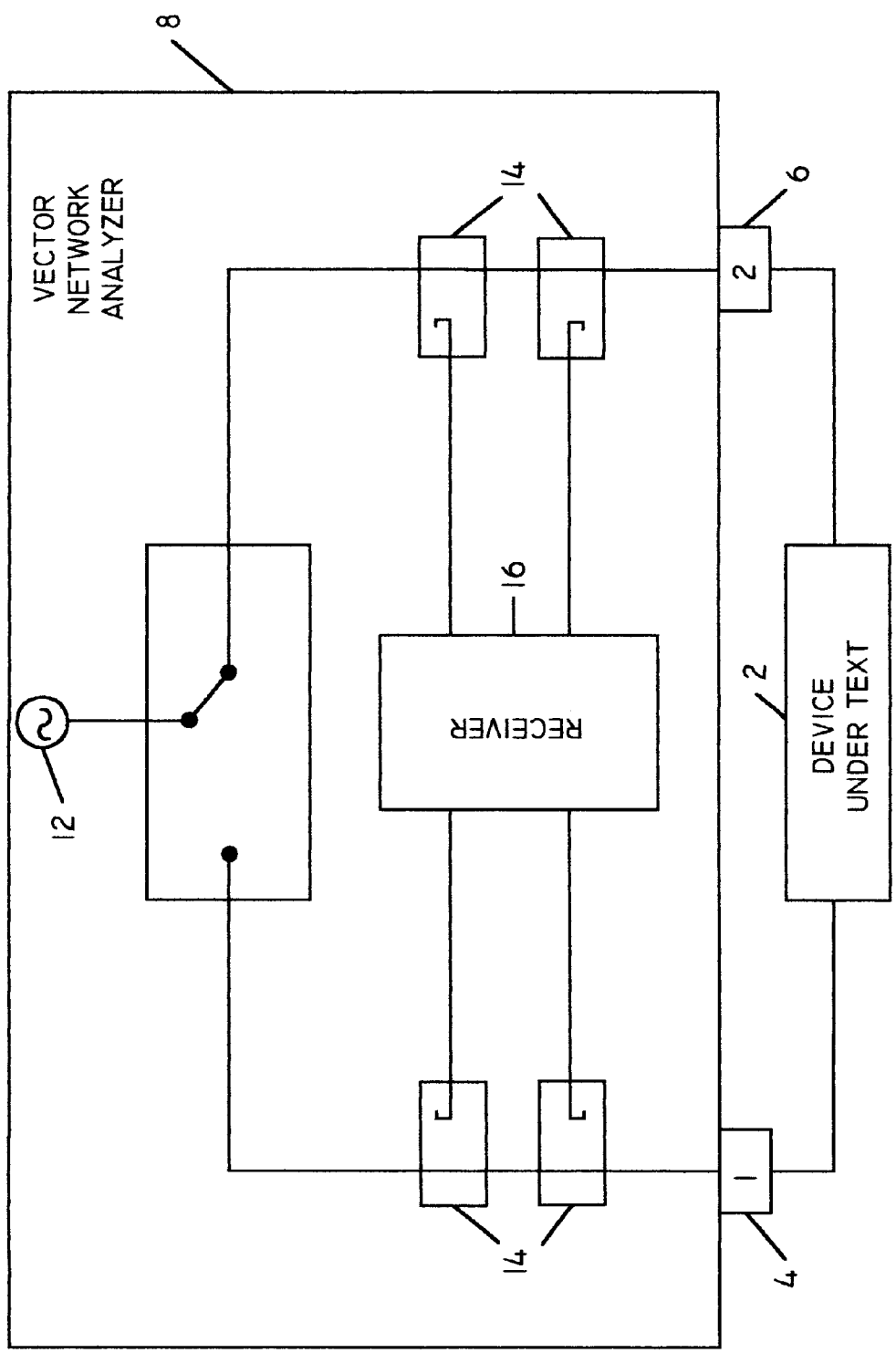

PROCESS FOR HARMONIC MEASUREMENT WITH ENHANCED PHASE ACCURACY

CROSS-REFERENCE TO PROVISIONAL APPLICATION

This Patent Application claims the benefit of Provisional Application No. 60/098,864, filed Sep. 2, 1998.

BACKGROUND OF THE INVENTION

1. Field of the Invention

The present invention relates to a method for determining a harmonic phase response of a device, and more particularly, to a method for determining a more accurate harmonic phase response of a device over a dynamic range not limited by the stimulus source harmonic level.

2. Background

Harmonic measurements are of significant importance in many microwave, millimeter wave, and radio frequency (RF) applications including wireless communications. Excessive harmonic generation by components such as amplifiers or other nonlinear components in a communications device can lead to violations of spectrum rules set by the Federal Communications Commission (FCC), failed performance specifications, interference with other channels, or other problems. Harmonic measurements have been made by using a conventional spectrum analyzer, but this approach can be quite slow and the results are of only limited accuracy. Therefore, conventional methods of harmonic measurements using spectrum analyzers may be undesirable in a high throughput manufacturing environment in which both speed and accuracy of harmonic measurements are required.

To satisfy the requirements of speed and accuracy in harmonic measurements in a high throughput manufacturing environment, measurement techniques have been developed by using conventional vector network analyzers. However, a problem associated with conventional non-ratioed techniques for measuring the harmonic responses of a device by using typical vector network analyzers is that the internal signal sources of typical vector network analyzers are usually not very "clean." The internal signal source of a typical vector network analyzer may generate a source harmonic in the range of −30 dB to −40 dB relative to the source fundamental frequency signal component. Although a source harmonic in the range of −30 dB to −40 dB relative to the source fundamental frequency component may not be regarded as a high harmonic level per se, the presence of such source harmonic can seriously affect the ability to accurately measure the harmonic response of a device. The presence of stimulus source harmonics can seriously limit the dynamic range of the measurements and the accuracy of the measurement results.

Therefore, there is a need for a method for measuring the harmonic response of a device with enhanced accuracy by using a typical vector network analyzer which may contain a source that has harmonics in addition to the source fundamental frequency component during the measurement of the device. Furthermore, there is a need for a method for measuring the harmonic response of a device to a fundamental frequency input with enhanced dynamic range that is not limited in measurement accuracy or dynamic range by the stimulus source harmonics.

SUMMARY OF THE INVENTION

In accordance with the present invention, a method is provided for calibration to eliminate phase errors when correcting measurements of a DUT to account for source harmonics. For phase corrections, a calibration is performed using a reference standard to establish a relationship between the harmonic phase response of the standard and the source fundamental. Calibration is then applied during measurement of a DUT to get the DUT harmonic phase response relative to the source fundamental.

An output from the DUT is composed of two elements, the DUT's harmonic response to a source fundamental, and the DUT's linear response to the harmonic input from the source. The vector sum of the DUT output responses, GHx, includes all composite harmonics from the DUT normally measured directly. Harmonics from the source which are linearly passed by the DUT, GNx, are also readily measured with a VNA. An output harmonic generated by the DUT, Hx, can then be calculated using vector subtraction according to the equation Hx=GHx−GNx. The output harmonic Hx will be free from source harmonic components.

To obtain a magnitude for the output harmonic |Hx'| relative to the source fundamental, the magnitude of Hx is multiplied by a relative source harmonic level. To obtain a magnitude of an output harmonic |Hx"| relative to an output fundamental, the magnitude of Hx is multiplied by a relative source harmonic level and then divided by the magnitude of a linear fundamental gain of the DUT.

To determine the phase for Hx' and Hx", a phase reference plane is established using the phase standard, which can be an element such as a shunt diode. When the shunt diode is used as a fundamental phase reference, the second harmonic can be referenced 180° out of phase with respect to the fundamental. The third harmonic can also be referenced 180° out of phase with respect to the fundamental. The offset established by this phase reference is applied to measurements after the calibration to determine phase for Hx' and Hx".

BRIEF DESCRIPTION OF THE DRAWINGS

The present invention will be described with respect to particular embodiments thereof, and references will be made to the drawings in which:

FIG. 3 is a simplified diagram illustrating a device under test connected to the terminals of the typical vector network analyzer to perform the process steps in the method for determining the harmonic response of the device according to the present invention.

DETAILED DESCRIPTION

For the method in accordance with the present invention, the output harmonic Hx of the DUT is established relative to the source harmonic, the source fundamental, and the output fundamental. To do so, several general steps are performed using a VNA as outlined in the following paragraphs.

I. Establishing Modes for Calculations

With the source fundamental frequency range covering frequencies from f0 through f1, labeled here as [f0,f1], then the following shorthand can be established for modes used in subsequent calculations:

MODE {N1}: source [f0,f1], receiver [f0,f1]

MODE {N2}: source [2f0,2f1], receiver [2f0,2f1]

MODE {N3}: source [3f0,3f1], receiver [3f0,3f1]

MODE {H2}: source [f0,f1], receiver [2f0,2f1]

MODE {H3}: source [f0,f1], receiver [3f0,3f1]

The numbers 2 and 3 multiplied by the frequency ranges f0–f1 indicate that the second and third harmonics are used respectively. The measurements and calculations described below utilize the second and third harmonics, but other source harmonic levels may be used as long as the measurement ratios determined according to the present invention are not excessively noisy.

To assure measurement accuracy in determining source harmonics, the source power level should be constant during measurements using the above modes. Because the source harmonics are a function of power level at least to some degree, changes in the source power can make calculations inaccurate. If the source is to be operated at different power levels, the corrections determined below must be repeated for each desired power level since source harmonics may vary between different power levels.

Figure 1:
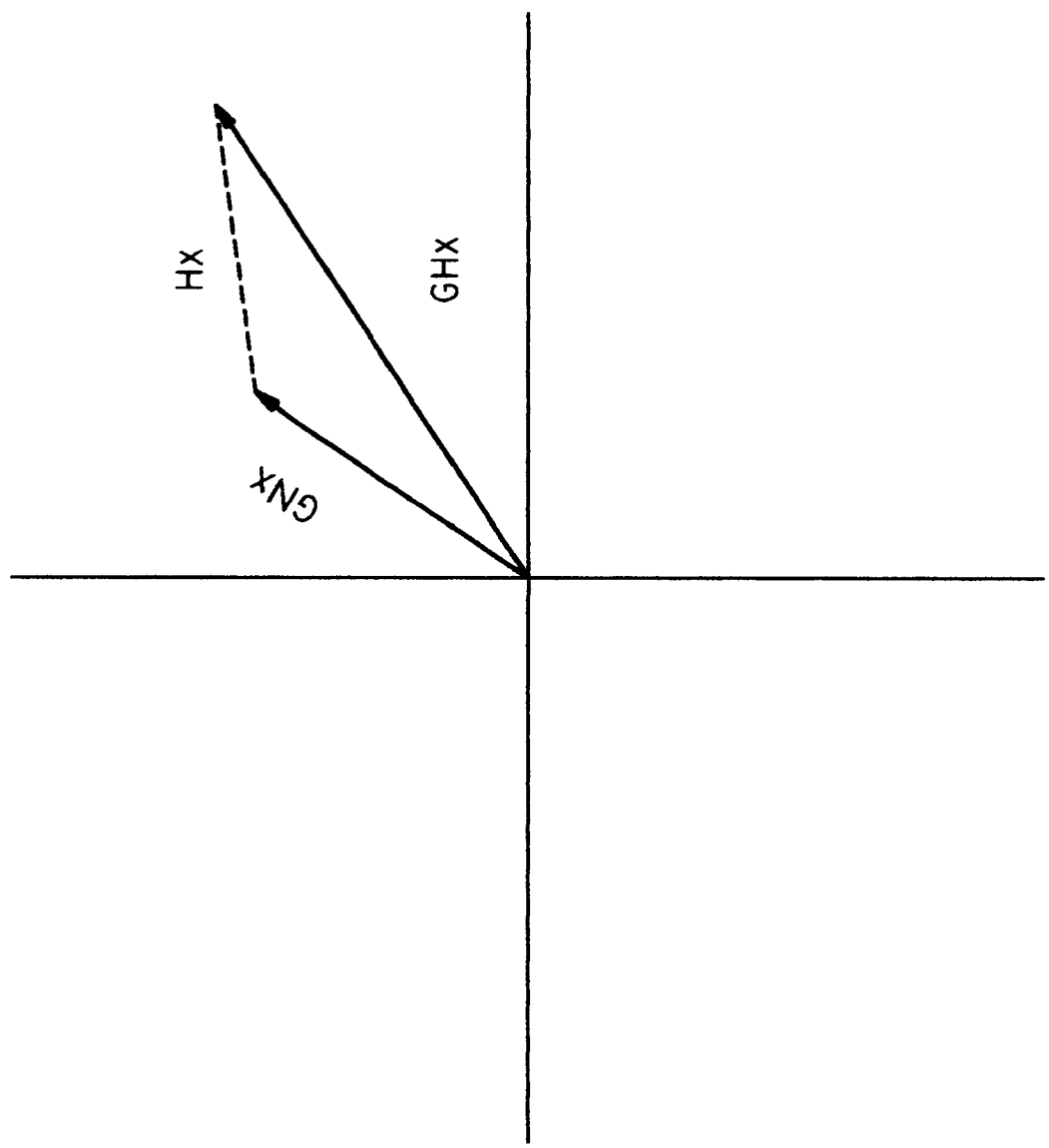
FIG. 1 is a vector diagram illustrating the relationship of the measured vector quantities GHx and GNx to the computed vector quantity Hx representing the harmonic response of a device obtained by the method according to the present invention.
Figure 2:
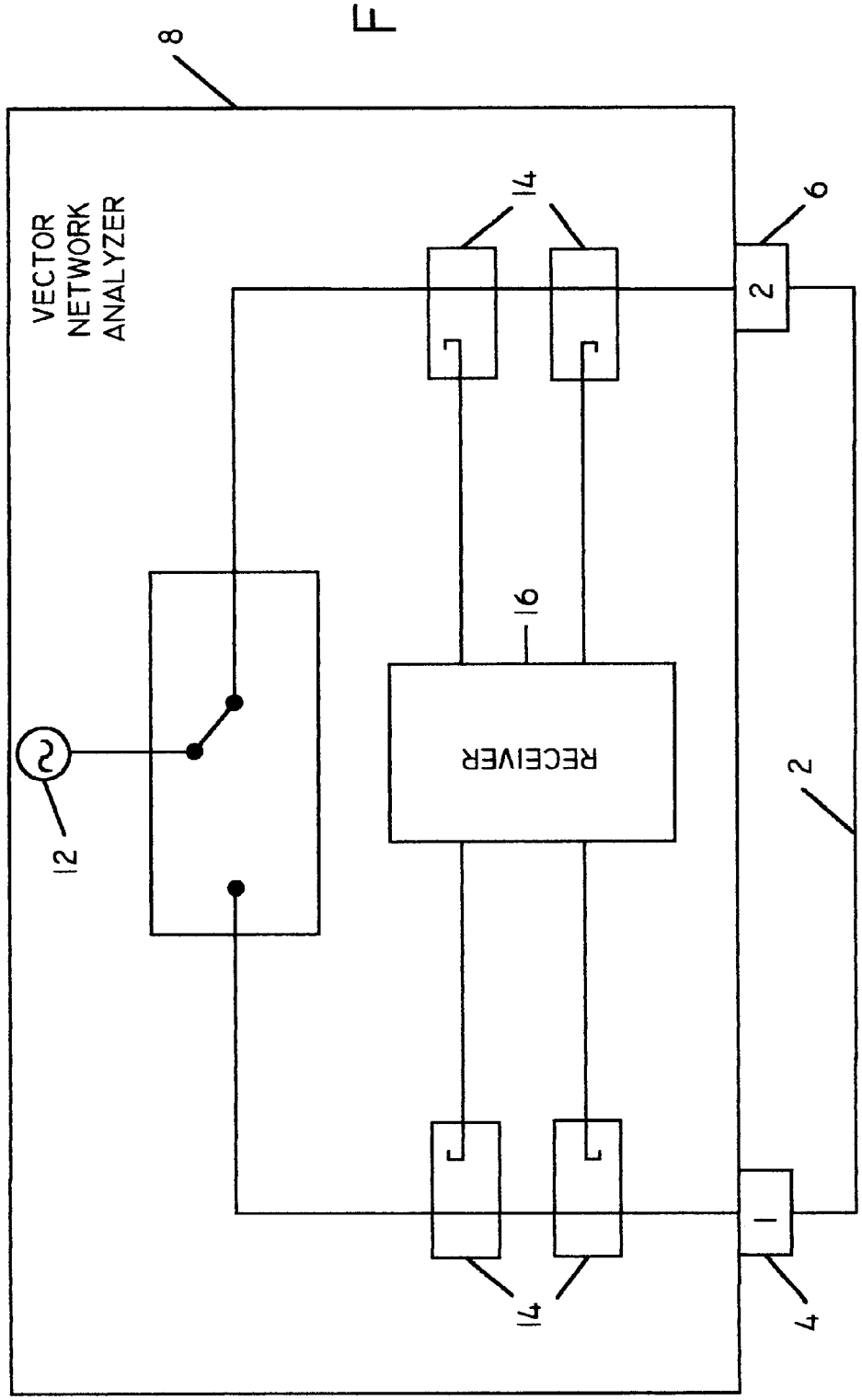
FIG. 2 is a simplified diagram illustrating a typical vector network analyzer with two terminals connected to a through line to establish normalization factors and a relative source harmonic level.

II. Connection of Through Line to Establish Normalizations and Relative Source Harmonic Levels In an embodiment in which the DUT to be measured is a two-port device, a test setup is established as shown in FIG. 2. In FIG. 2, a through line 2 is connected to the terminals 4 and 6 of a VNA 8 to establish a plurality of normalization factors and a relative source harmonic level before the DUT is connected to the VNA for subsequent measurements as shown in FIG. 3. As shown, the VNA includes a source 12 connectable through couplers 14 to terminals 4 and 6. A receiver 16 then receives signals from the DUT as well as source 12.

To establish the normalization factors, S21 measurements are first acquired from the through line with the system in modes N1, N2, N3, H2 and H3. The S21 values are stored as NS21N1, NS21N2, NS21N3, NS21H2 and NS21H3 respectively. These values will be used to normalize later DUT measurements. Note that the S21 measurements could be trivially replaced by S12 measurements if that is the requested parameter. For one-port S11 or S22 measurements, appropriate normalization is provided with a short.

The received signal, also referred to as the b2 signal, is measured in modes N1, H2 and H3. These b2 values are stored as b2(N1), b2(H2) and b2(H3) respectively.

To account for receiver power deviations from a flat level, an additional mode N0 is defined in which voltage measurements b2($NO_A$), b2($NO_B$) and b2($NO_C$) are made to normalize the b2(N1), b2(H2) and b2(H3) values. The N0 mode is established with the source 12 and receiver 14 operating over the same frequency range, such as f0–f1, as the mode being normalized, but with the source power level set at approximately 0 dBm. Note that it is possible that b2(N0) could be measured and stored as a global vector in the VNA at factory calibration time, since it is not likely to change over time on a scale that would cause errors in unrationed measurements.

Relative source harmonic levels Ox for the second and third harmonics are computed from the b2 values b2(N1), b2(H2) and b2(H3) as follows:

$$O2 = b2(H2)/b2(N1)$$

$$O3 = b2(H3)/b2(N1)$$

The relative source harmonic levels O2 and O3 are scalar quantities without phase information.

III. Connection of DUT and Measurement in Normal Mode

After the normalization factors and the relative source harmonic levels are established, the through line is disconnected and the DUT 10 is connected to the terminals 4 and 6 of a VNA 8 as shown in FIG. 3. Once the DUT 10 is connected, S21 measurements are made in the normal modes N1, N2 and N3. The normalization values NS21N1, NS21N2 and NS21N3 are then applied respectively to obtain transfer coefficients GN1, GN2 and GN3. The GNx vector quantities GN1, GN2 and GN3 are the linear gains that the source fundamental, the second source harmonic and the third source harmonic will experience through the DUT, respectively.

In an embodiment in which the DUT is a nonlinear amplifier, it is desirable that the input source harmonic be at a sufficiently low power level such that the amplifier operates either within the linear region or close to the linear region at the harmonic frequency to obtain the transfer coefficients GN2 and GN3. For example, the power level for the source harmonic during the step of obtaining the transfer coefficient GN2 for the second harmonic may be set at approximately −40 dBc relative to the power level of a carrier signal at the fundamental frequency.

IV. Measurement of DUT in Harmonic Mode

While the DUT is connected to the VNA, S21 measurements are also made in the harmonic modes H2 and H3. The normalization values NS21H2 and NS21H3 are then applied respectively to obtain transfer coefficients GH2 and GH3. The GHx values GH2 and GH3 are the DUT output harmonics relative to the source fundamental.

V. Computation of Corrections

With the measurements described above, the DUT output harmonic levels relative to the source harmonic component, the source fundamental frequency component, and the DUT output fundamental frequency component are calculated as follows:

A: Output Harmonic Hx Relative to Source Harmonic Component $$H2 = GH2 - GN2$$

$$H3 = GH3 - GN3$$

B: Output Harmonic Hx' Relative to Source Fundamental Frequency Component $$|H2'| = |GH2 - GN2|O2$$

$$|H3'| = |GH3 - GN3|O3$$

The computed values |H2'| and |H3'| are scalar quantities since phase information was not available for the Ox values O2 and O3. Alternatively, with only the magnitude of Ox available, the values Hx' could be calculated as vector quantities with the phase of Hx used for the phase of Hx'.

C: Output Harmonic Hx" Relative to Output Fundamental Frequency Component $$|H2''| = |GH2 - GN2|O2/|GN1|$$

$$|H3''| = |GH3 - GN3|O3/|GN1|$$

Again the computed values |H2"| and |H3"| are scalar quantities, but the values Hx" can be calculated as vector quantities with the phase of Hx/GNX used for the phase of Hx".

VI. Establishing Phase

Establishing the phase of harmonic components is particularly relevant for measurements of matching networks for power amplifier design. There is no direct method of establishing phase of the source fundamental relative to its harmonic. However, phase measurements can be made using a phase standard.

One phase standard which may be used in accordance with the present invention is a conventional shunt diode with sufficient RF power applied to it so that the diode starts clipping one side of the waveform. Based on a Fourier analysis, the second and third harmonic components from the DUT must be 180° out of phase relative to the source fundamental. The Fourier analysis is performed with a top-clipped cosine waveform with the reference phase being 0° for the source fundamental frequency component, which has a period T. The Fourier expansion is performed on a period centered at the origin and the clipping time is from −x to +x. Because this waveform represents an even function, only the cosine terms are present in the Fourier expansion. The Fourier coefficients are thus expressed as:

$$a_n = \frac{4}{T}\int_0^x \cos\left(\frac{2\pi x}{T}\right)\cos\left(\frac{2\pi n t}{T}\right)dt + \frac{4}{T}\int_x^{T/2}\cos\left(\frac{2\pi t}{T}\right)\cos\left(\frac{2\pi n t}{T}\right)dt$$

$$= \frac{2\cos\left(\frac{2\pi x}{T}\right)}{n\pi}\sin\left(\frac{2n\pi x}{T}\right) + \frac{1}{\pi}\left[\frac{-1}{n+1}\sin\left(\frac{2(n+1)\pi x}{T}\right) + \frac{-1}{n-1}\sin\left(\frac{2(n-1)\pi x}{T}\right)\right],$$

For the first harmonic or fundamental, $$a_1 = \frac{2\cos\left(\frac{2\pi x}{T}\right)}{n}\sin\left(\frac{2\pi x}{T}\right) + \frac{1}{\pi}\left[\frac{1}{2}\left(-\sin\left(\frac{4\pi x}{T}\right)\right) + 1 - \frac{2x}{T}\right]$$

Since $0<x<T/4$, this term will be positive, and the phase reference for the fundamental is 0°.

For the second harmonic, $$a_2 = \frac{\cos\left(\frac{2\pi x}{T}\right)}{\pi}\sin\left(\frac{4\pi x}{T}\right) + \frac{1}{\pi}\left[\frac{-1}{3}\sin\left(\frac{6\pi x}{T}\right) + \frac{-1}{1}\sin\left(\frac{2\pi x}{T}\right)\right]$$

Since $0<x<T/4$, it is easy to show that $a_2<=0$ and decreasing, and the phase shift is 180°.

For the third harmonic, $$a_3 = \frac{2\cos\left(\frac{2\pi x}{T}\right)}{3\pi}\sin\left(\frac{6\pi x}{T}\right) + \frac{1}{\pi}\left[\frac{-1}{4}\sin\left(\frac{8\pi x}{T}\right) + \frac{-1}{2}\sin\left(\frac{4\pi x}{T}\right)\right]$$

Since $0<x<T/4$, it is easy to show that $a_3<=0$, and the phase shift is 180°.

For the fourth harmonic, $$a_4 = \frac{\cos\left(\frac{2\pi x}{T}\right)}{2\pi}\sin\left(\frac{8\pi x}{T}\right) + \frac{1}{\pi}\left[\frac{-1}{5}\sin\left(\frac{10\pi x}{T}\right) + \frac{-1}{3}\sin\left(\frac{6\pi x}{T}\right)\right]$$

If $0<x/T\leq 0.17$, then $a_4<=0$ and the phase shift is 180°. If $x/T\geq 0.17$ indicating more severe clipping of the cosine waveform, $a_4>0$ and the phase shift is 0°. Therefore, the phase shift for the fourth harmonic relative to the phase of the fundamental frequency component depends upon the severity of clipping produced by the nonlinear DUT.

Measurements of Hx will acquire the phase angles $\Phi x$ needed for calculating the phase components of Hx' and Hx". The phase angles measured for Hx are preferably referenced to a 0° reference plane established at the fundamental. With the standard being the shunt diode described above and the fundamental referenced to 0° at the standard, the correction angles $180°-\Phi 2$ and $180°-\Phi 3$ for the second and third harmonics can be applied to obtain the phases of the vector quantities Hx' and Hx" . The use of an absolute phase reference plane eliminates the effect of any extra line length at the output of the DUT. The extra line length at the output of the DUT produces unreferenced output phases because of the different phase shifts experienced through the extra line length by the different harmonic signals.

To determine the harmonic phases in accordance with the present invention, a calibration standard, such as the shunt diode described above, is connected to the VNA. With the standard connected, S21 measurements are made in modes H2 and H3. The normalization vector values NS21H2 and NS21H3 are then applied to the H2 and H3 measurements respectively to obtain corrected transfer coefficients termed GH2C and GH3C. S21 measurements are further made with the standard connected in mode {N1} to obtain the transfer coefficient GN1. Next phase offsets POx are calculated as follows:

$\angle PO2=\angle ref2-\angle GH2C+\angle GN1$ $\angle PO3=\angle ref3-\angle GH3C+\angle GN1$ wherein $\angle PO2$ and $\angle PO3$ are the harmonic phase responses of the DUT at the second and third harmonics respectively, $\angle ref2$ and $\angle ref3$ are 180° as calculated using Fourier series analysis for the shunt diode, $\angle GH2C$ and $\angle GH3C$ are the phases of the corrected harmonic transfer coefficients GH2C and GH3C after normalization, and $\angle GN1$ is the phase of the transfer coefficient GN1 at the fundamental frequency.

After the harmonic phase responses $\angle PO2$ and $\angle PO3$ are obtained, the vector harmonic responses H2' and H3' of the DUT at the second and third harmonics to the input fundamental frequency component are obtained respectively according to the following relationships:

$H2'=(GH2-GN2)(1\angle PO2)O2$ $H3'=(GH3-GN3)(1\angle PO3)O3$

In a similar manner, the vector harmonic outputs H2" and H3" of the DUT at the second and third harmonics relative to the output fundamental frequency component are obtained respectively according to the following relationships:

$H2"=(GH2-GN2)(1\angle PO2)O2/GN1$ $H3"=(GH3-GN3)(1\angle PO3)O3/GN1$

The harmonic responses of the DUT to the input fundamental frequency component as well as the harmonic outputs of the DUT relative to the output fundamental frequency component are thus obtained as vector quantities with magnitude and phase information.

The present invention has been described with respect to particular embodiments thereof, and numerous modifications can be made which are within the scope of the invention as set forth in the claims.

What is claimed is:

1. A method for removing a source signal harmonic from a measurement of a harmonic phase response of a device under test (DUT) at a harmonic frequency by using a vector network analyzer (VNA) containing a signal source generating the source harmonic, the method comprising the steps of:

providing a phase reference ∠refx for the harmonic frequency;

determining a fundamental vector transfer response GN1 of the DUT to a first source signal at a fundamental frequency;

obtaining a harmonic vector transfer response GHx of the DUT at the harmonic frequency to an input which comprises an input fundamental frequency component at the fundamental frequency and an input harmonic component at the harmonic frequency;

correcting the phase of the harmonic vector transfer response GHx to obtain a corrected phase ∠GHxC;

subtracting the corrected phase ∠GHxC of the harmonic vector transfer response GHx from the phase reference ∠refx to obtain a difference ∠refx−∠GHxC; and adding the phase of the fundamental vector transfer response GN1 to the difference ∠refx−∠GHxC to obtain the harmonic phase response ∠POx.

2. The method of claim 1, wherein the harmonic frequency is twice the fundamental frequency, and wherein the phase reference ∠refx is 180°.

3. The method of claim 1, wherein the harmonic frequency is three times the fundamental frequency, and wherein the phase reference ∠refx is 180°.

4. The method of claim 1, wherein the letter x in GHx, ∠GHxC, ∠POx and ∠refx indicates a harmonic number for the harmonic frequency at which the harmonic phase response ∠POx is determined, the method further comprising the steps of:

defining a mode {N1} wherein S21 measurements are made with source tuned to the fundamental and a receiver tuned to the fundamental;

defining a mode {H2} wherein S21 measurements are made with the source tuned to the fundamental and the receiver tuned to the second harmonic;

defining a mode {H3} wherein S21 measurements are made with the source tuned to the fundamental and the receiver tuned to the third harmonic;

connecting a through line between first and second terminals of the VNA;

measuring the through line in the mode {N1} to establish a normalization factor NS21N1;

measuring the through line in the mode {H2} to establish a normalization factor NS21H2;

measuring the through line in the mode {H3} to establish a normalization factor NS21H3;

connecting the DUT between the first and second terminals of the VNA;

measuring the DUT in the mode {N1} and applying the normalization factor NS21N1 to obtain the phase ∠GN1 of the fundamental vector transfer response GN1;

measuring the DUT in the mode {H2} and applying the normalization factor NS21H2 to obtain the corrected phase ∠GH2C of the harmonic vector transfer response for the second harmonic GH2;

measuring the DUT in the mode {H3} and applying the normalization factor NS21H3 to obtain the corrected phase ∠GH3C of the harmonic vector transfer response for the third harmonic GH3;

calculating phase angle ∠ref2−∠GH2C+∠GN1 to obtain the harmonic phase response ∠PO2 for the second harmonic; and calculating phase angle ∠ref3−∠GH3C+∠GN1 to obtain the harmonic phase response ∠PO3 for the third harmonic.

5. The method of claim 4, wherein ∠ref2 equals 180°.

6. The method of claim 4, wherein ∠ref3 equals 180°.

7. The method of claim 1, further comprising the steps of:

connecting a through line between first and second terminals of the VNA;

measuring a first normalization factor NS21N1 when the through line is connected between the first and second terminals of the VNA, the first normalization factor NS21N1 comprising a vector ratio of a scattered voltage at the fundamental frequency to an incident voltage at the fundamental frequency; and measuring a second normalization factor NS21Hx when the through line is connected between the first and second terminals of the VNA, the second normalization factor comprising a vector ratio of a scattered voltage at the harmonic frequency to an incident voltage at the harmonic frequency, with the second source signal tuned to the fundamental.

8. The method of claim 7, wherein the step of determining the fundamental vector transfer response GN1 comprises the steps of:

connecting the DUT between the first and second terminals of the VNA;

measuring a first scattering parameter when the DUT is connected between the first and second terminals of the VNA, the first scattering parameter comprising a vector ratio of a scattered voltage at the fundamental frequency to an incident voltage at the fundamental frequency; and applying the first normalization factor NS21N1 to the first scattering parameter to obtain the fundamental vector transfer response GN1.

9. The method of claim 8, wherein the step of determining the harmonic vector transfer response GHx comprises the step of measuring a second scattering parameter when the DUT is connected between the first and second terminals of the VNA, the second scattering parameter comprising a vector ratio of a scattered voltage at the harmonic frequency to an incident voltage at the harmonic frequency with the second source signal tuned to the fundamental frequency.

10. The method of claim 9, wherein the step of correcting the phase of the harmonic vector transfer response GHx comprises the step of applying the second normalization factor NS21Hx to the second scattering parameter to obtain the corrected phase ∠GHxC of the harmonic vector transfer response GHx.

* * * * *